(12) United States Patent
Qian et al.

(10) Patent No.: US 9,542,522 B2
(45) Date of Patent: Jan. 10, 2017

(54) INTERCONNECT ROUTING CONFIGURATIONS AND ASSOCIATED TECHNIQUES

(71) Applicant: Intel Corporation, Santa Clara, CA (US)

(72) Inventors: Zhiguo Qian, Chandler, AZ (US); Kemal Aygun, Chandler, AZ (US); Dae-Woo Kim, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/491,693

(22) Filed: Sep. 19, 2014

(65) Prior Publication Data

US 2016/0085899 A1 Mar. 24, 2016

(51) Int. Cl.
| | | |
|---|---|---|
| *H01L 23/48* | (2006.01) | |
| *H01L 21/336* | (2006.01) | |
| *G06F 17/50* | (2006.01) | |
| *H01L 23/538* | (2006.01) | |
| *H01L 23/00* | (2006.01) | |
| *H01L 21/768* | (2006.01) | |

(52) U.S. Cl.
CPC ..... *G06F 17/5077* (2013.01); *H01L 21/76802* (2013.01); *H01L 23/5381* (2013.01); *H01L 23/5383* (2013.01); *H01L 24/16* (2013.01); *H01L 2924/15311* (2013.01)

(58) Field of Classification Search
CPC ............ H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541

USPC ....... 257/774, 522, 419, 773, 758, 737, 499, 257/762, 764, 506; 438/303, 591, 618, 438/421, 584, 637, 783, 763
See application file for complete search history.

(56) References Cited

U.S. PATENT DOCUMENTS

| | | | |
|---|---|---|---|
| 2005/0112866 A1* | 5/2005 | Takewaki | H01L 21/76838 438/622 |
| 2006/0017167 A1* | 1/2006 | Iguchi | H01L 23/522 257/758 |
| 2006/0226527 A1 | 10/2006 | Hatano et al. | |
| 2006/0289997 A1* | 12/2006 | Tomita | H01L 23/5329 257/758 |
| 2007/0120260 A1* | 5/2007 | Kitabayashi | G06F 17/5077 257/758 |

(Continued)

OTHER PUBLICATIONS

Office Action issued in U.S. Appl. No. 13/665,706, filed Oct. 31, 2012, mailed Jan. 29, 2014, 7 pages.

(Continued)

*Primary Examiner* — Selim Ahmed
*Assistant Examiner* — Moin Rahman
(74) *Attorney, Agent, or Firm* — Schwabe, Williamson & Wyatt, P.C.

(57) ABSTRACT

Embodiments of the present disclosure are directed toward interconnect routing configurations and associated techniques. In one embodiment, an apparatus includes a substrate, a first routing layer disposed on the substrate and having a first plurality of traces, and a second routing layer disposed directly adjacent to the first routing layer and having a second plurality of traces, wherein a first trace of the first plurality of traces has a width that is greater than a width of a second trace of the second plurality of traces. Other embodiments may be described and/or claimed.

15 Claims, 4 Drawing Sheets

(56) References Cited

U.S. PATENT DOCUMENTS

| | | | |
|---|---|---|---|
| 2008/0277798 A1 | 11/2008 | Lee et al. | |
| 2010/0327424 A1* | 12/2010 | Braunisch | H01L 23/5385 257/692 |
| 2011/0291167 A1 | 12/2011 | Shimooka et al. | |
| 2012/0007211 A1* | 1/2012 | Aleksov | H01L 22/32 257/508 |
| 2012/0161331 A1* | 6/2012 | Gonzalez | H01L 25/50 257/774 |
| 2013/0168854 A1 | 7/2013 | Karikalan et al. | |
| 2014/0042612 A1* | 2/2014 | Liu | H01L 21/76807 257/734 |
| 2014/0117552 A1* | 5/2014 | Qian | H01L 23/49827 257/762 |

OTHER PUBLICATIONS

Notice of Allowance issued in U.S. Appl. No. 13/665,706, filed Oct. 31, 2012, mailed Sep. 19, 2014, 5 pages.

Office Action mailed Jun. 21, 2016 for Taiwan Patent Application No. 104126392, 23 pages.

Office Action mailed Jun. 28, 2016 for Japanese Patent Application No. 2015-160885, 13 pages.

* cited by examiner

INTERCONNECT ROUTING CONFIGURATIONS AND ASSOCIATED TECHNIQUES

FIELD

Embodiments of the present disclosure generally relate to the field of integrated circuit (IC) assemblies, and more particularly, to interconnect routing configurations and associated techniques.

BACKGROUND

The drive for miniaturization of integrated circuit (IC) assemblies such as dies has created a similar drive to provide dense interconnections between dies in a package assembly. For example, interposers and bridges such as Embedded Multi-die Interconnect Bridge (EMIB) technologies are emerging to provide dense interconnect routing between dies or other electrical components. Such interposers and bridges may take advantage of semiconductor processing (e.g., CMOS) techniques to form dense interconnect routing features. However, such interconnection routing features may be highly lossy and capacitive, which may cause a signal rise time to decrease quadratically with a routing length and degrade power efficiency. For example, in some cases, every 0.16 picoFarad (pF) of capacitance may degrade power efficiency by as much as 0.1 picojoules per bit (pJ/b). While thicker dielectric materials and lower dielectric constants may help mitigate this effect, such changes to present processing scenarios may be risky and/or costly. Other techniques to reduce capacitance and time constant of interconnects to achieve higher signaling rates and power efficiency are needed. Routing configurations in interposers and bridges may be based on a layout design rule for Design For Manufacturing (DFM), which may facilitate fabrication with improved yields.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
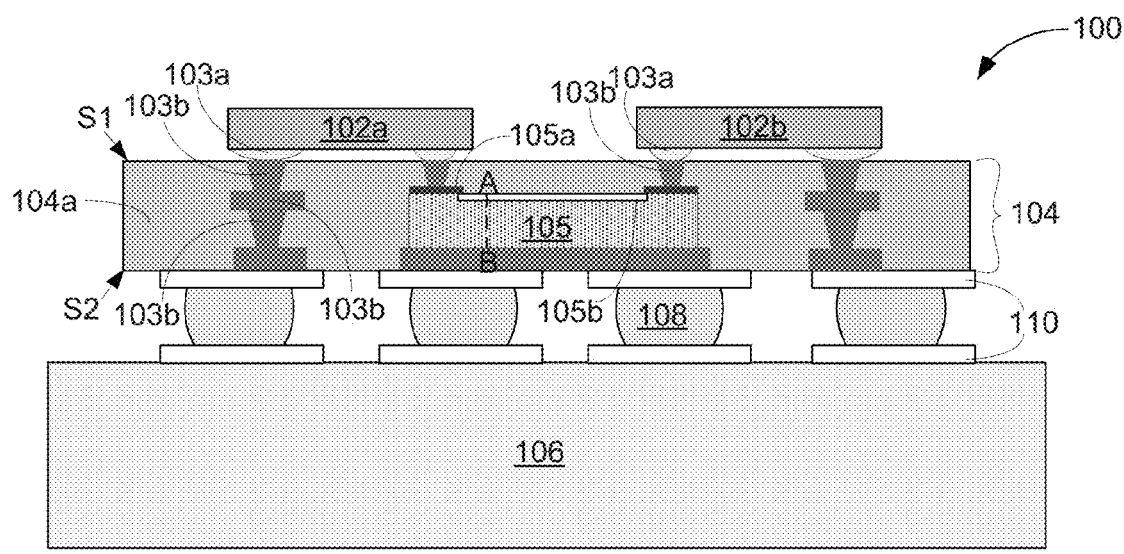
FIG. 1 schematically illustrates a cross-section side view of an example integrated circuit (IC) package assembly, in accordance with some embodiments.

Embodiments of the present disclosure describe interconnect routing configurations and associated techniques. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly (hereinafter "package assembly 100"), in accordance with some embodiments. According to various embodiments, the package assembly 100 may include dies 102a, 102b coupled with a package substrate 104 using first-level interconnect (FLI) structures 103a such as, for example, bumps, pillars or other die-level interconnect structures. The package substrate 104 may be coupled with a circuit board 106 using second-level interconnect (SLI) structures such as, for example, solder balls 108 or other suitable package-level interconnect structures. In the depicted embodiment, the dies 102a, 102b are mounted in a flip-chip configuration on the package substrate 104. The dies may be coupled with the package substrate 104 using other suitable techniques and configurations in other embodiments.

The package substrate 104 may include one or more routing structures 103b such as, for example, conductive traces, vias, and the like to route electrical signals of the dies 102a, 102b through the package substrate 104 including between a first side S1 and second side S2 of the package substrate 104 in some embodiments. The one or more routing structures 103b may be composed of any suitable electrically conductive material including, for example, a metal such as copper. In some embodiments, the one or more routing structures 103b may be configured to route electrical signals between one or both of the dies 102a, 102b and an electrical device external to the package substrate 104 such as, for example, a circuit board 106.

In some embodiments, a bridge interconnect structure (hereinafter "bridge 105") may be embedded in the package substrate 104 and configured to route electrical signals between the dies 102a, 102b. For example, in some embodiments, each of the dies 102a, 102b may be electrically coupled with the bridge 105 using FLI structures 103a and/or routing structures 103b that are coupled with die contacts 105a of the bridge 105. The die contacts 105a may include, for example, pads or traces on a surface of the bridge 105.

The bridge 105 may include one or more routing layers 105b having high density electrical routing features such as, for example, traces or other suitable features disposed between die contacts 105a that provide an electrical pathway for electrical signals between the dies 102a, 102b through the bridge 105. For example, the one or more routing layers 105b may comport with embodiments described in connection with FIGS. 2-5. The bridge 105 may provide routing for electrical signals such as, for example, input/output (I/O) signals and/or power/ground associated with operation of the dies 102a, 102b. In some embodiments, one of the dies 102a, 102b may be a processor such as a central processing unit (CPU) and the other of the dies 102a, 102b may be memory. In other embodiments, the die 102a or 102b may include, or be a part of a processor, memory, system-on-chip (SoC), or ASIC or may be configured to perform another suitable function. The bridge 105 may be composed of a variety of suitable materials including, for example, semiconductor materials or glass. In one embodiment, the bridge 105 may be composed of silicon and may be in the form of a die. The dashed line from A to B across the bridge 105 may represent a cross-section portion that is depicted and described in greater detail in the routing configuration of FIGS. 2-5.

In some embodiments, the package substrate 104 may be composed of an electrically insulative material 104a. In some embodiments, the electrically insulative material 104a may include material (e.g., epoxy-based material) of one or more build-up layers that at least partially encapsulate the bridge 105. In some embodiments, the electrically insulative material 104a disposed between the bridge 105 and the first side S1 of the package substrate 104 is an electrically insulative layer (e.g., build-up layer) of the package substrate 104. In some embodiments, the package substrate 104 is an epoxy-based laminate substrate having a core and/or build-up layers such as, for example, an Ajinomoto Build-up Film (ABF) substrate. The electrically insulative material 104a may include other suitable materials in other embodiments.

The package substrate 104 may include more or fewer routing structures 103b than depicted. In some embodiments, an electrically insulative material such as, for example, molding compound or underfill material (not shown) may at least partially encapsulate a portion of dies 102a and/or FLIs 103a.

The circuit board 106 may be a printed circuit board (PCB) composed of an electrically insulative material such as an epoxy laminate. For example, circuit board 106 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures such as traces, trenches, vias and the like may be formed through the electrically insulating layers to route the electrical signals of the dies 102a, 102b through the circuit board 106. The circuit board 106 may be composed of other suitable materials in other embodiments. In some embodiments, the circuit board 106 is a motherboard (e.g., motherboard 702 of FIG. 7).

Package interconnects such as, for example, solder balls 108, which may be arranged in a ball-grid array (BGA) configuration, may be coupled to one or more pads 110 on the second side S2 of the package substrate 104 and one or more pads 110 on the circuit board 106, as can be seen, to form corresponding solder joints that are configured to further route the electrical signals of the dies 102a, 102b between the package substrate 104 and the circuit board 106. The pads may be composed of any suitable material such as metal including, for example, nickel (Ni), palladium (Pd), gold (Au), silver (Ag), copper (Cu), or combinations thereof. Other suitable techniques to physically and/or electrically couple package substrate 104 with circuit board 106 may be used in other embodiments. For example, in some embodiments, package interconnects may include land-grid array (LGA) structures or other suitable structures.

Figure 2:
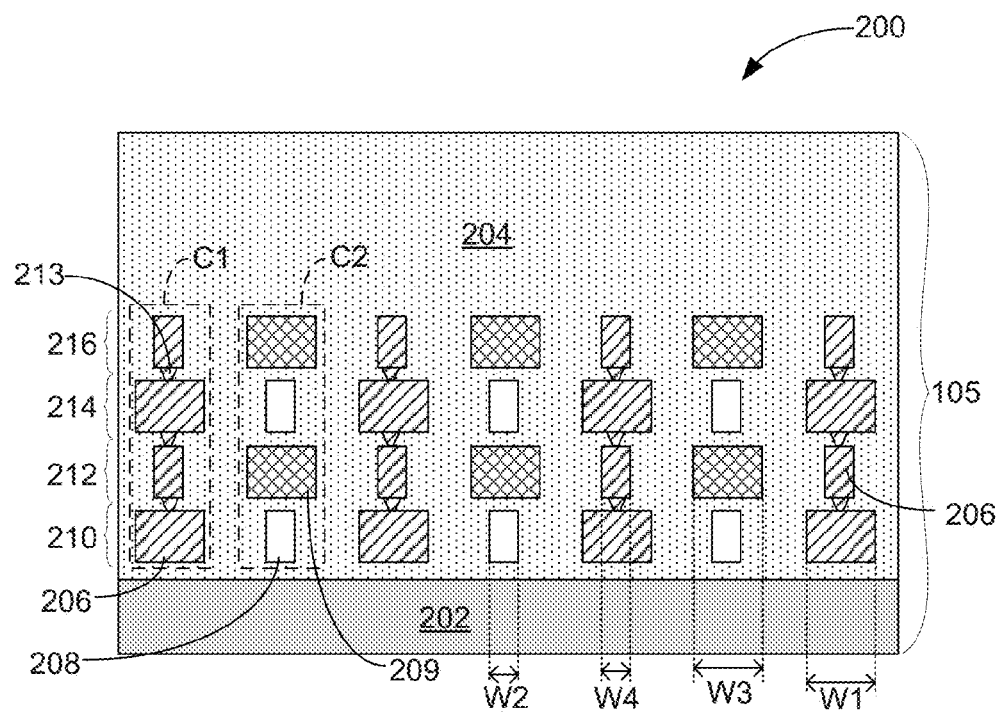
FIG. 2 schematically illustrates a cross-section side view of a routing configuration, in accordance with some embodiments.

FIG. 2 schematically illustrates a cross-section side view of a routing configuration 200, in accordance with some embodiments. In some embodiments, the routing configuration 200 may represent a cross-section portion of the bridge 105 depicted by dashed line AB in FIG. 1. The routing configuration 200 or structure may include a substrate 202 of a bridge 105 and a plurality of routing layers (e.g., routing layers 210, 212, 214 and 216) formed on the substrate 202. In some embodiments, the substrate 202 may be composed of a semiconductor material such as silicon or glass. The substrate 202 may be composed of other suitable materials in other embodiments.

Routing layers 210, 212, 214 and 216 may be formed on the substrate using, for example, semiconductor manufacturing techniques. For example, in some embodiments, the routing layers 210, 212, 214 and 216 may include routing structures (e.g., trenches and/or vias) formed using complementary metal-oxide-semiconductor (CMOS) fabrication techniques such as thin film deposition, etch and/or lithography processes to form high density routing structures. The techniques may be similar to those used to fabricate back-end interconnect routing (e.g., trenches and/or vias) on a die. The routing layers 210, 212, 214 and 216 may be disposed in an electrically insulative material 204 such as, for example, silicon oxide ($SiO_2$) or other well-known dielectric materials. In some embodiments, the routing layers 210, 212, 214 and 216 may be referred to as Metal 1 (MT1), Metal 2 (MT2), Metal 3 (MT3), and Metal 4 (MT4) layers, respectively.

According to various embodiments, each of the routing layers 210, 212, 214 and 216 may be configured to route electrical signals in a common direction (e.g., in and out of the page of FIG. 2) across the bridge 105 using conductive lines (e.g., traces 206, 209), which may extend parallel to one another. For example, the conductive lines may include ground traces 206 configured to route a ground connection and signal traces 209 configured to route I/O signals of the dies. The routing configuration 200 may further include dummy traces 208 that are not configured to route any electrical signals at all (e.g., not electrically connected to ground or I/O signals). The dummy traces may be formed to provide a density of material (e.g., metal) to facilitate fabrication. The traces 206, 208, 209 may be composed of an electrically conductive material such as metal. In one embodiment, the traces 206, 208, 209 are composed of copper.

In the depicted embodiment, a first routing layer 210 having a plurality of traces may be formed on the substrate 202 and a second routing layer 212 having a plurality of traces may be formed on the first routing layer 210, as can be seen. The first routing layer 210 may include ground traces 206 and dummy traces 208 disposed in an alternating arrangement, as can be seen. A width, W1, of the ground traces 206 in the first routing layer 210 may be greater than a width, W2, of the dummy traces 208 in the first routing layer 210.

The second routing layer 212 may include ground traces 206 and signal traces 209 disposed in an alternating arrangement such that the ground traces 206 in the second routing layer 212 are disposed directly over and adjacent to ground traces 206 in the first routing layer 210, as can be seen. That is, the ground traces 206 of the first routing layer 210 and the second routing layer 212 may be vertically aligned in a same column (e.g., column C1) of traces while the dummy traces 208 of the first routing layer 210 and the signal traces of the second routing layer 212 may be vertically aligned in a same column (e.g., column C2). Individual ground traces 206 of the first routing layer 210 may be disposed directly between individual ground traces 206 of the second routing layer 212 and the substrate 202, as can be seen.

A width, W3, of the signal traces 209 may be greater than a width, W4, of the ground traces 206 in the second routing layer 212, as can be seen. In some embodiments, the widths W1 and W3 may be the same and the widths W2 and W4 may be the same. In some embodiments, the widths W1 and W3 may range from 1 micron to 3 microns and the widths W2 and W4 may range from 0.5 micron to 1 micron. In some embodiments, the widths W1 or W3 may be 1.5 times or greater than widths W2 or W4. In some embodiments, the dummy traces 208 may be disposed directly adjacent to ground traces 206 in a same routing layer (e.g., the first routing layer 210 and the third routing layer 214) and the signal traces 209 may be disposed directly adjacent to ground traces 206 in a same routing layer (e.g., the second routing layer 212 and the fourth routing layer 216). The widths W1, W2, W3 and W4 may have other suitable values or relationships in other embodiments.

In some embodiments, other routing layers may be formed on the first routing layer 210 and the second routing layer 212. For example, in the depicted embodiment, a third routing layer 214 may be formed on the second routing layer 212 and a fourth routing layer 216 may be formed on the third routing layer 214. The third routing layer 214 may have ground traces 206 and dummy traces 208 disposed in a similar configuration as described and depicted in connection with corresponding traces in the first routing layer 210 and the fourth routing layer 216 may have ground traces 206 and signal traces 209 disposed in a similar configuration as described and depicted in connection with corresponding traces in the second routing layer 212.

The routing configuration 200 may provide a variety of benefits including, for example, improved electrical performance while still providing high density routing. For example, signal traces 209 may not be disposed in the first routing layer 210 to increase a distance between the substrate 202 and the signal traces 209. For example, in a case where the substrate 202 is composed of bulk silicon which has a high permittivity, omitting signal traces 209 in the first routing layer 210 may avoid a higher capacitance due to the substrate 202. Thus, the second routing layer 212 may provide a lower capacitance environment for the signal traces 209. Dummy traces 208 may effectively increase a distance of signal traces 209 to ground and, thus, may reduce the capacitance of the signal traces 209 to ground. A width and spacing between signal traces 209 and ground traces 206 may be designed according to a desired resistance and/or capacitance. For example, a wider width (or smaller spacing) may reduce resistance and increase capacitance while a smaller width (or wider spacing) may reduce capacitance and increase resistance. The ground traces 206 in the second routing layer 212 and fourth routing layer 216 may have a width, W4 that is designed to meet a minimum trace width design rule and/or to provide a minimum metal density to facilitate fabrication. The narrower widths W2, W4 of dummy traces 208 and/or ground traces 206 may allow for closer placement of adjacent traces within a same routing layer or different routing layers. The dummy traces 208 in the first routing layer 210 and the third routing layer 214 may provide a metal density that facilitates fabrication using semiconductor processing techniques relative to a configuration that does not include dummy traces. The dummy traces 208 may be electrically floating (e.g., not electrically connected), which may reduce capacitance of adjacent signal traces 209.

In some embodiments, the routing configuration 200 may be used in a four layer Embedded Multi-Die Interconnect Bridge (EMIB) having a routing density of 300 input/output traces (IO) (e.g., signal traces 209) per millimeter (IO/mm). The routing configuration 200 may be implemented in other suitable interconnect applications in other embodiments including, for example, routing for an active die (e.g., part of interconnect layer on an active device layer of the die) or another type of interposer. The routing configuration 200 may include more or fewer routing layers than depicted in other embodiments.

In some embodiments, the routing configuration 200 may include one or more vias 213 disposed between adjacent ground traces 206 in a same column (e.g., column C1 or column C2). The vias 213 may electrically couple the ground traces 206 together to form a mesh structure. In one embodiment, a pitch between adjacent ground traces 206 in a same routing layer may be about 6.88 microns to provide a density of vias 213 that facilitates fabrication of the routing configuration 200 using semiconductor processing techniques.

In some embodiments, the traces 206, 208, 209 may have a thickness in the vertical direction that is about 1.4 microns and the vias 213 may have a thickness that is about 0.6 microns. The traces 206, 208, 209 and vias 213 may have other suitable thicknesses in other embodiments. In one embodiment, the routing configuration 200 may achieve about 5% more eye margin than conventional microstrip/stripline configurations, which may be equivalent to an increase of routing length by about 1 mm.

Figure 3:
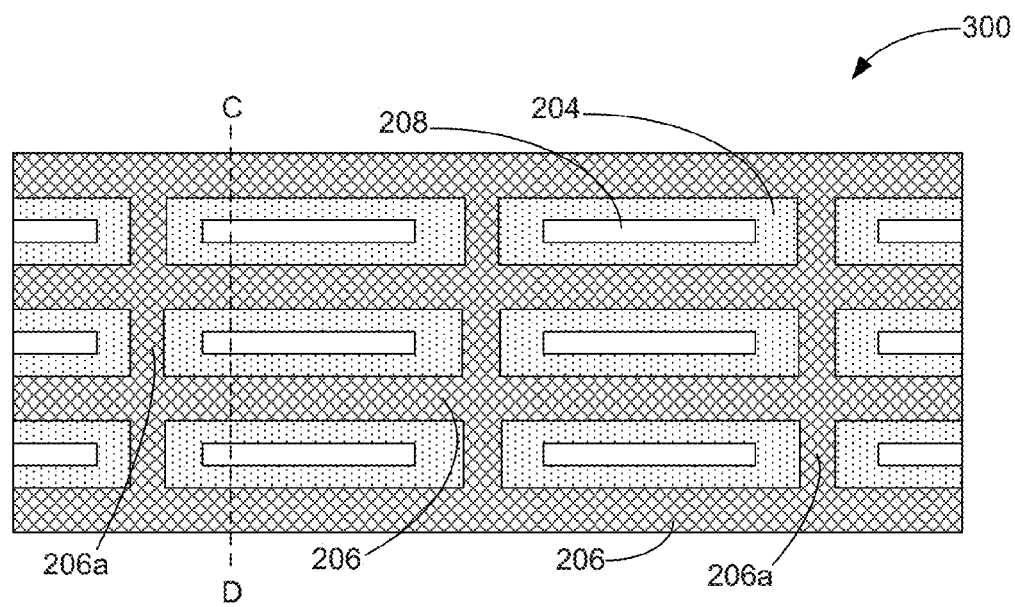
FIG. 3 schematically illustrates a cross-section top view of a ground plane arrangement of the routing configuration of FIG. 2, in accordance with some embodiments.

FIG. 3 schematically illustrates a cross-section top view of a ground plane arrangement 300 of the routing configuration 200 of FIG. 2, in accordance with some embodiments. The ground plane arrangement 300 may represent, for example, a cross-section top view of the first routing layer 210 or third routing layer 214 of FIG. 2. In some embodiments, the cross-section side view of the routing configuration 200 of FIG. 2 may include a cross-section view of the ground plane arrangement 300 of FIG. 3 along the dashed line from C to D.

According to various embodiments, the ground plane arrangement 300 may include a mesh structure formed by ground traces 206 that extend in a lengthwise direction from left to right on the page of FIG. 2 and are electrically coupled together by conductive lines 206a that extend perpendicular to the ground traces 206 and form a lateral ground connection. The conductive lines 206a may include metal features such as trenches that are formed during a same fabrication process that is used to form the ground traces 206.

Dummy traces 208 may be disposed between adjacent ground traces 206 and between adjacent conductive lines 206a, as can be seen. In some embodiments, each of the dummy traces 208 may be encapsulated in an electrically insulative material 204 such as $SiO_2$ or other dielectric material. The dummy traces 208 may extend in the lengthwise direction, as can be seen. In some embodiments, individual dummy traces 208 have a length in the lengthwise direction of about 50 microns. The dummy traces 208 may have other suitable dimensions in other embodiments.

Figure 4:
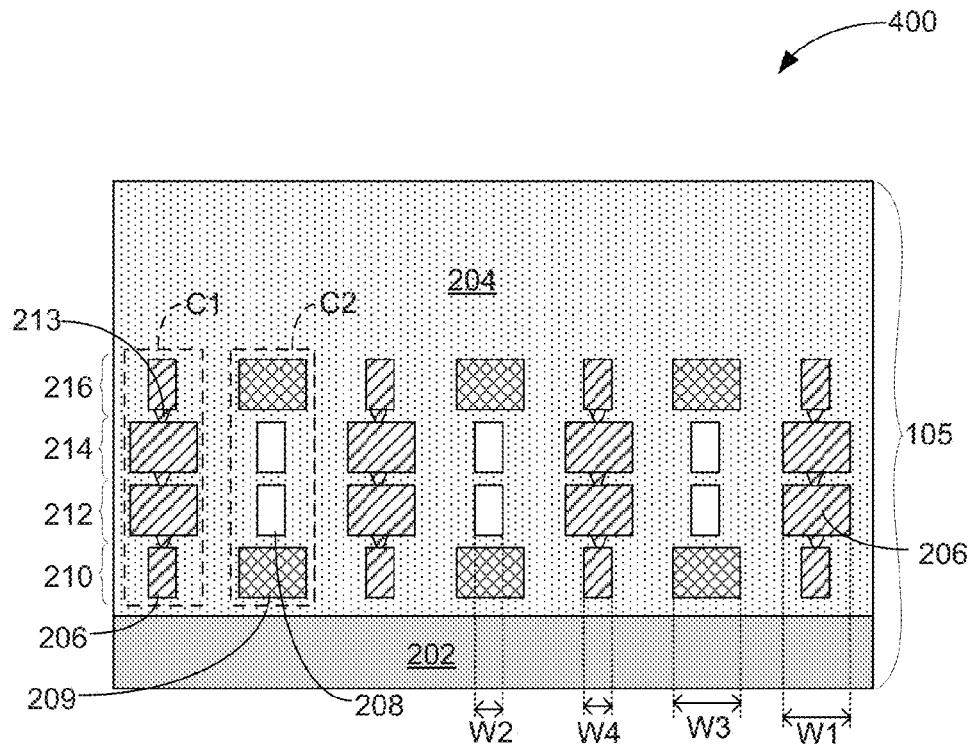
FIG. 4 schematically illustrates a cross-section side view of another routing configuration, in accordance with some embodiments.

FIG. 4 schematically illustrates a cross-section side view of another routing configuration 400, in accordance with some embodiments. The routing configuration 400 of FIG. 4 may depict the routing configuration 200 of FIG. 2 where the first routing layer 210 of FIG. 2 is switched with the second routing layer 212 of FIG. 2. In some embodiments, the routing configuration 400 may provide an arrangement of traces 206, 208, 209 in the third routing layer 214 and fourth routing layer 216 that are mirror images of an arrangement of traces 206, 208, 209 in the first routing layer 210 and second routing layer 212, as can be seen.

In some embodiments, the first routing layer 210 may include ground traces 206 and signal traces 209 disposed in an alternating arrangement. The ground traces 206 may be disposed directly adjacent to the signal traces 209 in the first routing layer 210 and fourth routing layer 216. The ground traces 206 in the first routing layer 210 have a width W4 that is smaller than a width W3 of the signal traces 209.

The second routing layer 212 may include ground traces 206 and dummy traces 208 disposed in an alternating arrangement such that the ground traces 206 in each routing layer share a same column (e.g., column C1) and the signal traces 209 and dummy traces 208 in each routing layer share a same column (e.g., column C2). The ground traces 206 may be disposed directly adjacent to the dummy traces 208 in the second routing layer 212 and third routing layer 214.

In some embodiments, the first routing layer 210 and the fourth routing layer 216 may have a same arrangement of traces 206, 208. The second routing layer 212 and the third routing layer 214 may have a same arrangement of traces 206, 209. In some embodiments, ground traces 206 having width W1 in the second routing layer 212 and the third routing layer 214 may be disposed directly adjacent to one another and dummy traces 208 having width W2 in the second routing layer 212 and the third routing layer 214 may be disposed directly adjacent to one another, as can be seen. The routing configuration 400 may reduce crosstalk between two signals in a same column by keeping them farther apart vertically relative to the routing configuration 300.

Figure 5:
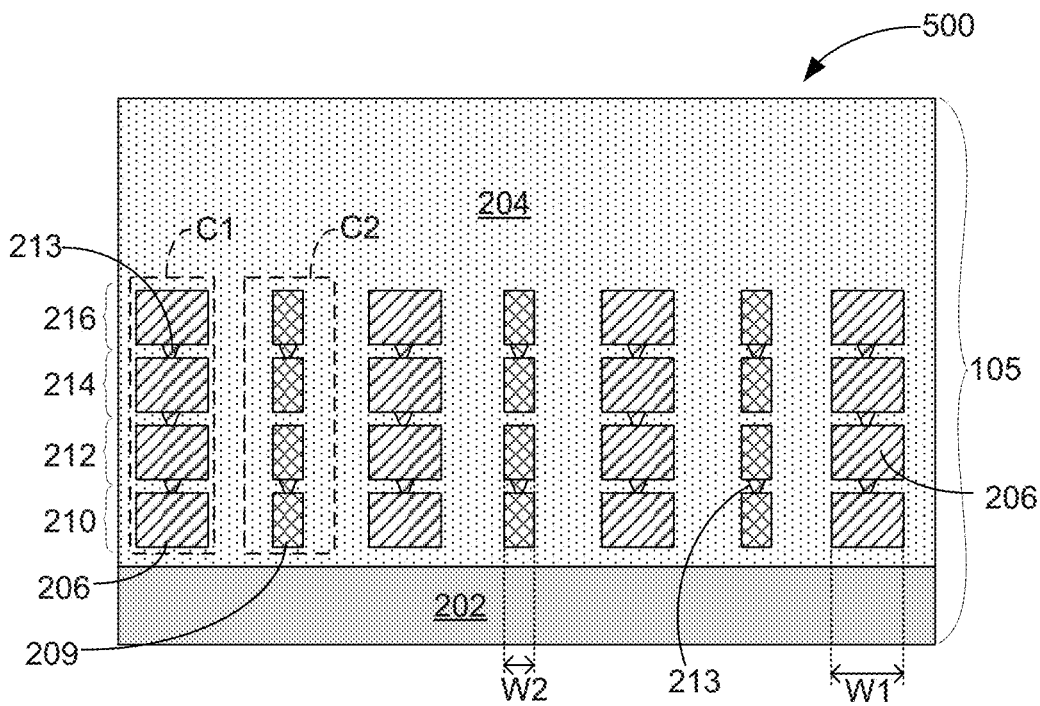
FIG. 5 schematically illustrates a cross-section side view of yet another routing configuration, in accordance with some embodiments.

FIG. 5 schematically illustrates a cross-section side view of yet another routing configuration 500, in accordance with some embodiments. According to various embodiments, in the routing configuration 500, each of the first routing layer 210, the second routing layer 212, the third routing layer 214 and the fourth routing layer 216 may have a same alternating configuration of ground traces 206 and signal traces 209, as can be seen.

In some embodiments, the ground traces 206 and the signal traces 209 are arranged to form respective columns (e.g., column C1) of ground traces 206 and columns (e.g., column C2) of signal traces 209, as can be seen. In some embodiments, the ground traces 206 may have a width W1 that is greater than a width W2 of the signal traces 209.

In some embodiments, the ground traces 206 in the routing layers 210, 212, 214 and 216 may be coupled together using vias 213, as can be seen. In some embodiments, pairs of the signal traces 209 in different routing layers may be coupled together using vias 213. For example, in the depicted embodiment, signal traces 209 in the first routing layer 210 are electrically coupled with directly adjacent signal traces 209 in the second routing layer 212 by the vias 213 to route a same signal across the first routing layer 210 and the second routing layer 212. Similarly, signal traces in the third routing layer 214 are electrically coupled with directly adjacent signal traces 209 in the fourth routing layer 216 by the vias 213 to route a same signal across third routing layer 214 and the fourth routing layer 216.

According to various embodiments, the ground trace 206 in the first routing layer 210 is disposed directly between any of the ground traces 206 that are within a same column (e.g., column C1) in the second routing layer 212, the third routing layer 214 and the fourth routing layer 216 and the substrate 202. According to various embodiments, the signal trace 209 in the first routing layer 210 is disposed directly between any of the signal traces 209 that are within a same column (e.g., column C2) in the second routing layer 212, the third routing layer 214 and the fourth routing layer 216 and the substrate 202. The routing configuration 500 may utilize two parallel traces for a same signal, which may add redundancy so that the signal still functions even if one of the traces is broken in the fabrication, which may improve yield of products including the routing configuration 500.

In some embodiments, the routing configurations 200, 400 or 500 may include more or fewer routing layers than depicted. In some embodiments, the routing configurations 200, 400 or 500 may be suitably combined together or with other routing configurations on a same interconnect assembly.

Figure 6:
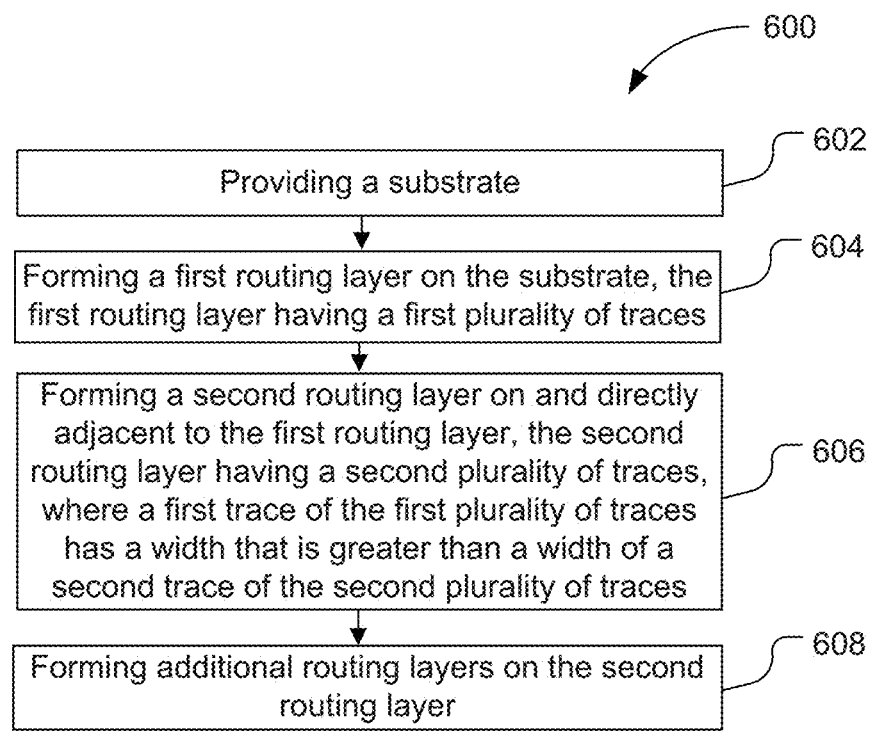
FIG. 6 schematically illustrates a flow diagram for a method of fabricating a routing structure, in accordance with some embodiments.

FIG. 6 schematically illustrates a flow diagram for a method 600 of fabricating a routing structure (e.g., the routing configuration 200, 400 or 500 of FIG. 2, 4 or 5), in accordance with some embodiments. The method 600 may comport with embodiments described in connection with FIGS. 1-5 and vice versa.

At 602, the method 600 may include providing a substrate (e.g., substrate 202). The substrate may include, for example, a semiconductor material such as silicon or glass or other suitable material. In some embodiments, the substrate may be processed according to well-known semiconductor manufacturing techniques (e.g., CMOS techniques) to produce interconnect circuitry.

At 604, the method 600 may include forming a first routing layer (e.g., first routing layer 210 of FIG. 2, 4 or 5) on the substrate, the first routing layer having a first plurality of traces (e.g., traces 206, 208 of FIG. 2, traces 206, 209 of FIG. 4 or traces 206, 209 of FIG. 5). The first routing layer may be formed using semiconductor fabrication techniques such as film deposition to deposit a layer of electrically insulative material (e.g., electrically insulative material 204 of FIG. 2, 3, 4 or 5) on the substrate and patterning processes such as lithography and/or etch to selectively remove portions of the electrically insulative material for deposition of a metal to form the plurality of traces. Different widths (e.g., widths W1, W2, W3, or W4 of FIG. 2, 4 or 5) of the traces may be achieved by using masks with different sizes for the traces as part of the patterning processes.

At 606, the method may include forming a second routing layer (e.g., second routing layer 212 of FIG. 2, 4 or 5) on and directly adjacent to the first routing layer, the second routing layer having a second plurality of traces (e.g., traces 206, 209 of FIG. 2, traces 208, 209 of FIG. 4 or traces 206, 209 of FIG. 5), where a first trace of the first plurality of traces has a width that is greater than a width of a second trace of the second plurality of traces. For example, in each of the configurations 200, 400, or 500 of respective FIG. 2, 4, or 5, at least one trace in the first routing layer has a width that is greater than a width of a trace in the second routing layer. The traces in the first and second routing layers may be formed to provide the configurations 200, 400, or 500 described in connection with FIG. 2, 4, or 5.

The second routing layer may be formed according to techniques described in connection with the first routing layer. In some embodiments, forming the second routing layer may include forming one or more vias (e.g., vias 213 of FIGS. 2, 4, and/or 5 or vias 213 of FIG. 5) to electrically couple traces of the second routing layer with traces of the first routing layer. In some embodiments, the vias and traces of a same routing layer may be formed together as part of a dual damascene process or they may be independently formed by separate patterning and fill processes according to conventional techniques.

At 608, the method 600 may include forming additional routing layers on the second routing layer. For example, third and fourth routing layers (e.g., the third and fourth routing layers 214 and 216 of FIG. 2, 4, or 5) may be formed on the first and second routing layers according to techniques described in connection with the first and second routing layers. In some embodiments, the substrate may be thinned substantially after fabrication to facilitate embedding into an IC package assembly. Various operations are described as multiple discrete operations in turn, in a manner that is most helpful in understanding the claimed subject matter. However, the order of description should not be construed as to imply that these operations are necessarily order dependent.

Figure 7:
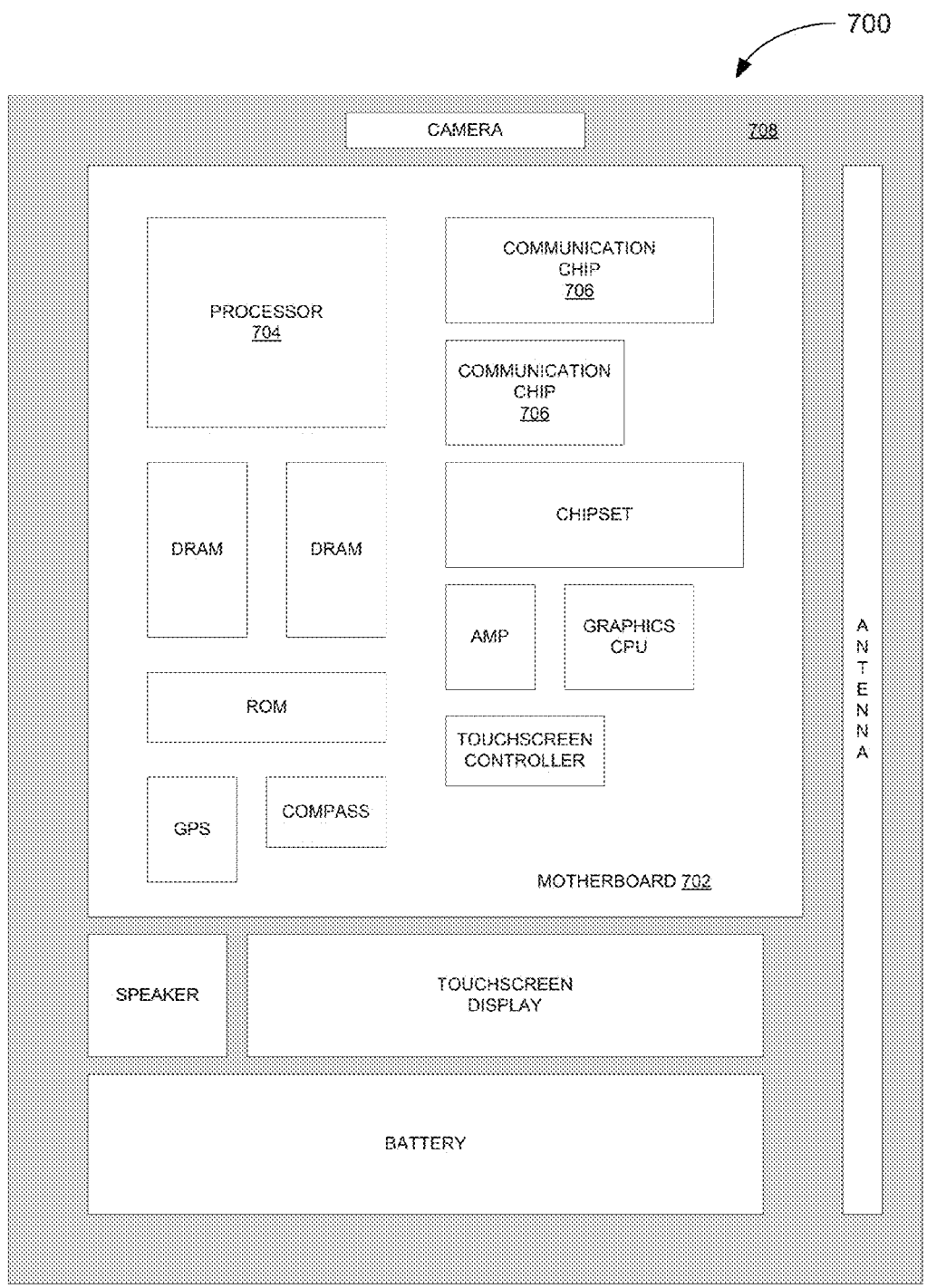
FIG. 7 schematically illustrates a computing device that includes an IC package assembly as described herein, in accordance with some embodiments.

Embodiments of the present disclosure may be implemented into a system using any suitable hardware and/or software to configure as desired. FIG. 7 schematically illustrates a computing device that includes an IC package assembly (e.g., IC package assembly 100 or bridge 105 of FIG. 1) as described herein, in accordance with some embodiments. The computing device 700 may house a board such as motherboard 702 (e.g., in housing 708). The motherboard 702 may include a number of components, including but not limited to a processor 704 and at least one communication chip 706. The processor 704 may be physically and electrically coupled to the motherboard 702. In some implementations, the at least one communication chip 706 may also be physically and electrically coupled to the motherboard 702. In further implementations, the communication chip 706 may be part of the processor 704.

Depending on its applications, computing device 700 may include other components that may or may not be physically and electrically coupled to the motherboard 702. These other components may include, but are not limited to, volatile memory (e.g., dynamic random access memory (DRAM)), non-volatile memory (e.g., read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, EV-DO, and others.

The processor 704 of the computing device 700 may be packaged in an IC assembly (e.g., IC package assembly 100 of FIG. 1) and/or coupled with a bridge (e.g., bridge 105 of FIG. 1) as described herein. For example, referring briefly to FIG. 1 and FIG. 7, the circuit board 106 of FIG. 1 may be a motherboard 702 and the processor 704 may be a die 102*a* mounted on or embedded in a package substrate 104 of FIG. 1 and coupled with a bridge 105 having a routing configuration (e.g., routing configuration 200, 400 or 500 of FIG. 2, 4 or 5) described herein. The bridge 105 may be thinned before being embedded into a package substrate 104 in order to reduce product thickness and/or improve electrical performance. The package substrate 104 and the motherboard 702 may be coupled together using package-level interconnects such as solder balls 108. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 706 may also include a die that may be packaged in an IC assembly (e.g., IC package assembly 100 of FIG. 1) and/or coupled with a bridge (e.g., bridge 105 of FIG. 1) as described herein. In further implementations, another component (e.g., memory device or other integrated circuit device) housed within the computing device 700 may include a die that may be packaged in an IC assembly (e.g., IC package assembly 100 of FIG. 1) and/or coupled with a bridge (e.g., bridge 105 of FIG. 1) as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 700 may be a mobile computing device in some embodiments. In further implementations, the computing device 700 may be any other electronic device that processes data.

EXAMPLES

According to various embodiments, the present disclosure describes an apparatus. Example 1 of an apparatus may include a substrate, a first routing layer disposed on the substrate and having a first plurality of traces and a second routing layer disposed directly adjacent to the first routing layer and having a second plurality of traces, wherein a first trace of the first plurality of traces has a width that is greater than a width of a second trace of the second plurality of traces. Example 2 may include the apparatus of Example 1, wherein the first trace is disposed directly between the second trace and the substrate. Example 3 may include the apparatus of Example 2, wherein the first trace is coupled with the second trace by a via. Example 4 may include the apparatus of Example 2, wherein the first trace and the second trace are ground traces. Example 5 may include the apparatus of Example 4, wherein a third trace of the first plurality of traces has a width that is less than a width of a fourth trace of the second plurality of traces, the third trace is directly adjacent to the first trace, and the fourth trace is directly adjacent to the second trace. Example 6 may include the apparatus of Example 5, wherein the third trace is a dummy trace and the fourth trace is signal trace. Example 7 may include the apparatus of Example 2, wherein the first trace is a signal trace and the second trace is a dummy trace. Example 8 may include the apparatus of Example 7, wherein a third trace of the first plurality of traces has a width that is less than a width of a fourth trace of the second plurality of traces, the third trace is directly adjacent to the first trace, the fourth trace is directly adjacent to the second trace, the third trace and the fourth trace are ground traces that are electrically coupled together. Example 9 may include the apparatus of Example 1, wherein the first plurality of traces includes a third trace, the second plurality of traces includes a fourth trace, the third trace is disposed directly between the second trace and the semiconductor substrate, and the first trace is disposed directly between the fourth trace and the semiconductor substrate. Example 10 may include the apparatus of Example 9, wherein the second trace and the third trace are signal traces having a same width and the first trace and the fourth trace are ground traces having a same width. Example 11 may include the apparatus of Example 10, wherein the second trace and the third trace are electrically coupled together to route a same signal across the first routing layer and the second routing layer.

According to various embodiments, the present disclosure describes a method. Example 12 of a method may include providing a substrate, forming a first routing layer on the substrate, the first routing layer having a first plurality of traces, and forming a second routing layer on and directly adjacent to the first routing layer, the second routing layer having a second plurality of traces, wherein a first trace of the first plurality of traces has a width that is greater than a width of a second trace of the second plurality of traces. Example 13 may include the method of Example 12, wherein forming the second routing layer comprises forming the second trace such that the first trace is disposed directly between the second trace and the substrate. Example 14 may include the method of Example 12, further comprising coupling the first trace with the second trace by forming a via. Example 15 may include the method of Example 12, wherein the first trace and the second trace are ground traces. Example 16 may include the method of claim 15, wherein a third trace of the first plurality of traces has a width that is less than a width of a fourth trace of the second plurality of traces, the third trace is directly adjacent to the first trace and the fourth trace is directly adjacent to the second trace. Example 17 may include the method of claim 16, wherein the third trace is a dummy trace and the fourth trace is a signal trace. Example 18 may include the method of claim 13, wherein the first trace is a signal trace and the second trace is a dummy trace. Example 19 may include the method of claim 18, wherein a third trace of the first plurality of traces has a width that is less than a width of a fourth trace of the second plurality of traces, the third trace is directly adjacent to the first trace, the fourth trace is directly adjacent to the second trace, and the third trace and the fourth trace are ground traces that are electrically coupled together. Example 20 may include the method of claim 18, wherein the first plurality of traces includes a third trace, the second plurality of traces includes a fourth trace, the third trace is disposed directly between the second trace and the semiconductor substrate, and the first trace is disposed directly between the fourth trace and the semiconductor substrate.

According to various embodiments, the present disclosure may describe a package assembly comprising a package substrate and a bridge interconnect embedded in the package substrate, the bridge interconnect including a substrate, a first routing layer disposed on the substrate and having a first plurality of traces, and a second routing layer disposed directly adjacent to the first routing layer and having a second plurality of traces, wherein a first trace of the first plurality of traces has a width that is greater than a width of a second trace of the second plurality of traces. Example 22 may include the package assembly of claim 21, further comprising a first die electrically coupled with the bridge interconnect and a second die electrically coupled with the bridge interconnect, wherein at least one of the first routing layer and the second routing layer is configured to route electrical signals between the first die and the second die.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
a substrate;
a first routing layer disposed on the substrate and having a first plurality of traces; and
a second routing layer disposed directly adjacent to the first routing layer and having a second plurality of traces, wherein a first trace of the first plurality of traces has a width that is greater than a width of a second trace of the second plurality of traces, and a third trace of the first plurality of traces has a width that is less than a width of a fourth trace of the second plurality of traces, and the first trace and the second traces are ground traces, and the third trace is a dummy trace, and the fourth trace is a signal trace.

2. The apparatus of claim 1, wherein the first trace is disposed directly between the second trace and the substrate.

3. The apparatus of claim 2, wherein the first trace is coupled with the second trace by a via.

4. The apparatus of claim 1, wherein:
the third trace is directly adjacent to the first trace in the first routing layer; and
the fourth trace is directly adjacent to the second trace in the second routing layer.

5. The apparatus of claim 1, wherein:
the third trace is disposed directly between the fourth trace and the substrate.

6. A package assembly comprising:
a package substrate; and
a bridge interconnect embedded in the package substrate, the bridge interconnect including:
a substrate,
a first routing layer disposed on the substrate and having a first plurality of traces, and
a second routing layer disposed directly adjacent to the first routing layer and having a second plurality of traces, wherein a first trace of the first plurality of traces has a width that is greater than a width of a second trace of the second plurality of traces, and a third trace of the first plurality of traces has a width that is less than a width of a fourth trace of the second plurality of traces, and the first trace and the second traces are ground traces, and the third trace is a dummy trace, and the fourth trace is a signal trace, and the fourth trace is electrically decoupled from the third trace.

7. The package assembly of claim 6, further comprising:
a first die electrically coupled with the bridge interconnect; and
a second die electrically coupled with the bridge interconnect, wherein at least one of the first routing layer and the second routing layer is configured to route electrical signals between the first die and the second die.

8. The apparatus of claim 1, wherein the width of the first trace is the same as the width of the fourth trace.

9. The apparatus of claim 1, wherein the width of the third trace is the same as the width of the second trace.

10. The package assembly of claim 6, wherein the first trace is disposed directly between the second trace and the substrate.

11. The package assembly of claim 6, wherein the first trace is coupled with the second trace by a via.

12. The package assembly of claim 6, wherein:
the third trace is directly adjacent to the first trace in the first routing layer; and
the fourth trace is directly adjacent to the second trace in the second routing layer.

13. The package assembly of claim 6, wherein the third trace is disposed directly between the fourth trace and the substrate.

14. The package assembly of claim 6, wherein the width of the first trace is the same as the width of the fourth trace.

15. The package assembly of claim 6, wherein the width of the third trace is the same as the width of the second trace.

* * * * *